United States Patent [19]

Sinofsky et al.

[11] Patent Number: 5,235,551
[45] Date of Patent: Aug. 10, 1993

[54] MEMORY ADDRESSING SCHEME

[75] Inventors: Brian Sinofsky, San Diego; Fred Lundquist, Levcadia; Cliff Quayle, Carlsbad, all of Calif.

[73] Assignee: Pacific Data Products, Inc., San Diego, Calif.

[21] Appl. No.: 638,688

[22] Filed: Jan. 8, 1991

[51] Int. Cl.⁵ .............................................. G11C 13/00
[52] U.S. Cl. .......................... 365/230.01; 365/189.01
[58] Field of Search ...................... 365/230.01, 230.02, 365/230.04, 230.05, 230.06, 185.01, 185.02

[56] References Cited

U.S. PATENT DOCUMENTS

5,097,118 3/1992 Jijima .............................. 365/230.01

Primary Examiner—Terrell W. Fears
Attorney, Agent, or Firm—Hecker & Harriman

[57] ABSTRACT

A method for increasing the addressable memory space of an addressed line limited computer system. In the present invention, at least two memory planes, plane zero and plane one, are provided. Each memory plane contains the maximum number of addresses that can be addressed by the available address lines. The present invention constrains the starting addresses of individual character data that are valid in each memory plane. For example, if the addresses of the memory planes are configured in hexadecimal, memory plane zero contains valid starting addresses only at those locations having a least significant nibble of zero or eight. Memory plane one is constrained to have valid starting addresses, for example, at those addresses having a least significant nibble of "4" or "C". A processing means is provided to determine when a starting address is provided to the memory. The processor determines which memory plane can accept the starting address as a valid starting address and enables the address lines to communicate with that memory plane. More memory planes can be defined by reviewing more bits in the starting address. For example, if two bits are reviewed, four memory planes can be defined. For a given number of address lines N reviewed, the maximum number of memory planes is $2^N$.

23 Claims, 4 Drawing Sheets

| Memory Plane 0 | |
|---|---|
| 0000- | HEADER |
| 0001 | |
| 0002 | |
| 0003 | |
| 0004 | |
| 0005 | |
| 0006 | |
| 0007 | |
| 0008 | Start Address (Character Data) |
| 0009 | Character Data |
| 000A | Character Data |
| 000B | Character Data |
| 000C | Character Data |
| 000D | Character Data |
| 000E | Character Data |
| 000F | |
| 0010 | Start Address (Character Data) |
| 0011 | Character Data |
| 0012 | Character Data |
| 0013 | Character Data |
| 0014 | Character Data |
| 0015 | Character Data |
| 0016 | Character Data |
| 0017 | Character Data |
| 0018 | Character Data |
| 0019 | Character Data |
| 001A | Character Data |
| 001B | |
| 001C | |
| 001D | |
| 001E | |
| 000F | |
| 0020 | Start Address (Character Data) |
| 0021 | Character Data |
| 0022 | Character Data |
| 0023 | Character Data |
| 0024 | Character Data |
| 0025 | Character Data |
| 0026 | Character Data |
| 0027 | |
| 0028 | Start Address (Character Data) |
| 0029 | Character Data |
| 002A | Character Data |
| 002B | Character Data |
| 002C | Character Data |
| 002D | Character Data |
| 002E | |
| 002F | |
| 0030 | Start Address (Character Data) |
| 0031 | Character Data |
| 0032 | Character Data |
| 0033 | Character Data |
| 0034 | Character Data |
| | • |
| | • |
| | • |
| 1FFFFD | |
| 1FFFFE | |
| 1FFFFF | |

| Memory Plane 1 | |
|---|---|
| 0000- | HEADER |
| 0001 | |
| 0002 | |
| 0003 | |
| 0004 | Start Address (Character Data) |
| 0005 | Character Data |
| 0006 | Character Data |
| 0007 | Character Data |
| 0008 | Character Data |
| 0009 | Character Data |
| 000A | Character Data |
| 000B | |
| 000C | Start Address (Character Data) |
| 000D | Character Data |
| 000E | Character Data |
| 000F | Character Data |
| 0010 | Character Data |
| 0011 | Character Data |
| 0012 | Character Data |
| 0013 | |
| 0014 | Start Address (Character Data) |
| 0015 | Character Data |
| 0016 | Character Data |
| 0017 | Character Data |
| 0018 | Character Data |
| 0019 | Character Data |
| 001A | |
| 001B | |
| 001C | Start Address (Character Data) |
| 001D | Character Data |
| 001E | Character Data |
| 000F | Character Data |
| 0020 | Character Data |
| 0021 | Character Data |
| 0022 | Character Data |
| 0023 | |
| 0024 | Start Address (Character Data) |
| 0025 | Character Data |
| 0026 | Character Data |
| 0027 | Character Data |
| 0028 | Character Data |
| 0029 | Character Data |
| 002A | Character Data |
| 002B | Character Data |
| 002C | Character Data |
| 002D | Character Data |
| 002E | Character Data |
| 002F | |
| 0030 | |
| 0031 | |
| 0032 | |
| 0033 | |
| 0034 | Start Address (Character Data) |
| | • |
| | • |
| | • |
| 1FFFFD | |
| 1FFFFE | |
| 1FFFFF | |

MEMORY ADDRESSING SCHEME

BACKGROUND OF THE PRESENT INVENTION

1. Field of the Invention

This invention relates to the field of memory addressing schemes. In particular, this invention relates to a memory addressing scheme for laser printer font or program cartridges.

2. Background Art

Computer systems provide visual output on computer displays, such as a cathode ray tube (CRT), or to a printer to produce hard copy. A typical use of a printer on a computer system is to provide hard copy of text output from a word processor or other text editing program. One type of printer used with computer systems is known as a "laser printer." In a laser printer, a laser beam is used to scan across the surface of a photosensitive material to form patterns of electrical charge. The photosensitive material, which may be disposed on a drum, normally has a negative charge. Wherever the laser strikes the drum, a relatively positive "dot" of charge is created. These dots combine to form patterns, images and letters on the surface of the drum. Negatively charged toner particles are attracted to the positively charged dots on the surface of the drum. This toner pattern is then transferred to a sheet of paper passed adjacent to the drum. The toner image, which is now printed on the paper, is fused by passing the paper and toner through a heated roller, and the printed page exits from the printer.

A laser printer is not limited in the type of pattern or image that can be created on the drum. Therefore, laser printers are used to provide a variety of typefaces or "fonts" for displaying text characters.

A font is a collection of character representations that are of a specific typeface (such as Courier, Times, etc.) combined with a specific style (Bold, Italic, Bold & Italic, etc.).

One type of font utilized by computer systems and laser printers is referred to as a "scalable outline font." In a scalable outline font, each character of the font is made up of a series of curves. The curves are defined as extending between a number of control points on the borders of a font character (hence the name "outline" fonts). Because the outline of each character is a mathematical description of a character shape, an outline font character can be scaled to virtually any size and still maintain its shape. When printed on a laser printer, an outline font character is translated to a "bit map" (series of dots) that fills the outline defined by the mathematical description of the character.

Printers that use scalable outline fonts come with a specific set of "built in" outline font data, referred to as "resident" font data, stored in the printer. The resident font data is stored in a non-volatile memory, such as a read only memory (ROM). The ROM includes character description and information for each character of each resident font. One area of the ROM is reserved as a "header" that identifies the resident fonts available to a computer user using the printer and the addresses of the character information for each character of a font.

Often, computer users desire to use fonts in addition to those resident fonts provided by a laser printer. Some printers provide mechanisms for adding additional scalable outline fonts, to provide a larger number of scalable outline fonts to choose from. One such mechanism provided is the "font cartridge," which can be inserted into the printer. The cartridge is normally composed of a fixed amount of readable memory that can be accessed by the printer's internal microprocessor. The printer's internal program is designed to recognize the presence of the font cartridge, and add any scalable outline fonts in the cartridge to the fonts available for use.

The font cartridge includes header information several hundred bytes in size and describes information common to all the characters described in the font, along with the locations in the cartridge of the "character" data for each of the several hundred characters described in the font.

Each instance of "character" data, identified in the common header, describes the appearance of a single character within the font, and is several hundred bytes in size. The majority of cartridge space is taken up by character data.

A disadvantage of laser printer font cartridges is that they are "address limited," that is, the number of address lines that can be used to address memory locations is fixed. In typical embodiments, only 2 megabytes of memory per cartridge can be addressed. This imposes a 2 megabyte limit on the amount of data that can be built into a scalable font cartridge, which effectively limits the cartridge to about twenty-five (25) scalable outline fonts.

A number of prior art attempts have been made to provide expanded memory configurations for address limited systems. Nielsen, U.S. Pat. No. 4,368,515 is directed to a bank switchable memory system. Nielsen describes a method of expanding the number of ROM memory locations that can be addressed by a computer system without requiring additional address lines. The scheme of Nielsen is used in connection with a game cartridge ROM for a video game system. The scheme of Nielsen uses an address decode logic block coupled to a 12-bit address line to search for certain predefined addresses. When these pre-defined addresses are detected, a flip-flop is enabled that adds an extra bit to the most significant bit (MSB) of the address lines. This effectively provides a 13-bit address line instead of the 12-bit address line provided by the computer system. Selection between the two groups of memory is achieved by designating a specific predefined 12-bit address as a "decode A" address and a second predefined 12-bit address as a "decode B" address. When the address decode logic block detects decode A or decode B, the appropriate output of a flip-flop is enabled so that subsequent 12-bit addresses access the appropriate memory locations in the selected memory bank.

Balaska, U.S. Pat. No. 4,485,457, is also directed to a memory system for use as a video game system that has a limited number of address lines. The system of Balaska uses a decoding circuit coupled to a data bus and an address bus. The data bus is coupled to a random access memory and the address communicates to a read-only memory. A decoding circuit is coupled to the data bus and to the address bus. The decoding circuit detects a predetermined address and a predetermined status of selected data lines and produces a signal that selects one of the plurality of ROM segments of memory locations. The device of Balaska provides three banks of ROM that are addressed by three particular 12-bit ROM read signals.

Lushtak, U.S. Pat. No., 4,503,491 is directed to a computer with an addressing capability greater than the number of addresses that can be generated by its address lines. The device of Lushtak provides a plurality of memory banks and bank selection is effected by supplying a first address which enables a bank-select decoding logic. The device of Lushtak requires predefined addresses to select a memory location.

Kummer, U.S. Pat. No. 4,609,996 is directed to a microcomputer that uses a memory expansion module. The memory system associated with a central processing unit (CPU) comprises a base memory and an add-on expansion memory. When both memories are installed, one memory has even-numbered addresses and another has odd-numbered addresses. The CPU accesses individual address locations, but a subsystem addresses even addresses to obtain data from the even address memory bank and the next higher odd address. The least significant bit of the address bits is used to indicate which memory bank (even or odd) is to be accessed. If the address is an even address, the address is provided to the memory bank storing even addresses. If the incoming address is odd, the last bit is dropped and a more significant bit is added to the address and the memory bank containing the odd number of bits is accessed.

Yokoyama, U.S. Pat. No. 4,866,671 describes a system for expanding character generator ROM and buffer RAM space in a printer by searching for empty areas in an address space of a printer memory and utilizing the empty space for additional storage.

Nakagawa, U.S. Pat. No. 4,926,372, describes a memory cartridge in which a large capacity ROM is provided. Storage area of the ROM is divided into a plurality of banks having memory addresses accessible by a CPU. Bank enable data is stored in each of the memory banks. When an access is made to a particular bank, data stored in that bank is read out to the processor. If that data includes a data work pointing to another memory bank, that memory bank is then enabled.

Prior art solutions to limited memory addressing capabilities have a number of disadvantages. One particular disadvantage is the fact that memory bank switching information must be predefined and made known to the CPU or other device accessing the memory. In other cases, additional address lines must be added to provide expanded addressability. None of the prior art solutions provide a scheme that expands memory address space while remaining transparent to the "host system" and without requiring additional address lines.

SUMMARY OF THE INVENTION

The present invention provides a method for increasing the addressable memory space of an addressed line limited computer system. In the present invention, at least two memory planes, plane zero and plane one, are provided. Each memory plane contains the maximum number of addresses that can be addressed by the available address lines. The present invention constrains the starting addresses of individual character data that are valid in each memory plane. For example, if the addresses of the memory planes are configured in hexidecimal, memory plane zero contains valid starting addresses only at those locations having a least significant nibble of "0" or "8". Memory plane one is constrained to have valid starting addresses, for example, at those addresses having a least significant nibble of "4" or "C". A processing means is provided to determine when a starting address is provided to the memory. The processor determines which memory plane can accept the starting address as a valid starting address and enables the address lines to communicate with that memory plane. More memory planes can be defined by reviewing more bits in the starting address. For example, if two bits are reviewed, four memory planes can be defined. For a given number of address lines N reviewed, the maximum number of memory planes is $2^N$.

DETAILED DESCRIPTION OF THE INVENTION

A memory addressing scheme is described. In the following description, numerous specific details, such as number of address lines, number of memory planes, etc., is set forth in detail in order to provide a more thorough description of the invention. It will be apparent, however, to one skilled in the art, that the present invention may be practiced without these specific details. In other instances, well known features have not been described in detail so as not to obscure the present invention.

Figure 1:
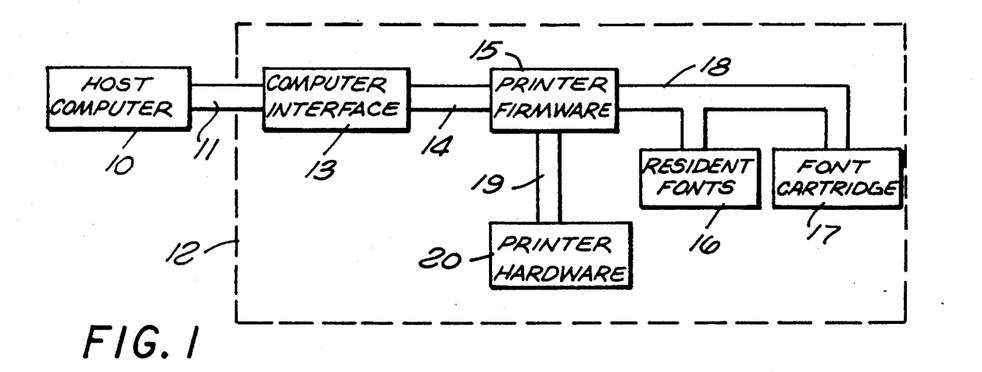
FIG. 1 is a block diagram of a computer/printer system.

A block diagram of a computer/printer system is illustrated in FIG. 1. A host computer 10 communicates to a printer (indicated by dashed line 12), on bus 11. The host computer sends print commands to computer interface 13. The computer interface 13 communicates with printer firmware 15 on bus 14. The printer firmware 15 includes control algorithms to govern the operation of the printer 12. The printer firmware provides address data and control information to the resident font 16 and font cartridge 17 on bus 18. The printer firmware 15 also communicates with print hardware 20 on bus 19.

In operation, the host computer 10 provides a print command to the printer 12, requesting a certain font character. The computer interface 13 provides this command to the printer firmware 15. The firmware determines whether the character is found in the resident font block 16 or the font cartridge 17. An appropriate enable signal is provided to the resident font 16 or font cartridge 17, depending on the location of the desired character information. The appropriate font character is then accessed and output data is provided on bus 18 to printer firmware 15. The printer firmware 15 then uses this information to drive the print hardware 20, so that the desired character is printed.

Figure 2:
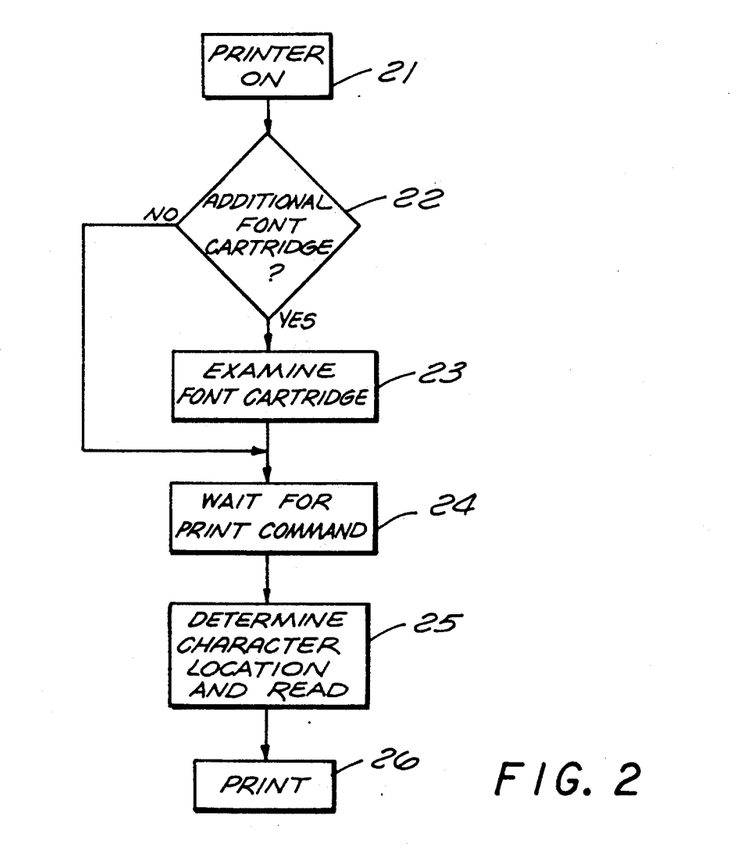
FIG. 2 is a flow diagram of printer operation.

The operation of a prior art print cycle is illustrated in FIG. 2. At step 21, a printer is initialized or turned on and examines its resident fonts. Resident fonts are stored in a read only memory (ROM). The ROM is divided into a first "header" area and a second "character information area". The header contains information about the available fonts and address information, such as the starting address of each character in the available fonts. At decision block 22, the printer determines if it contains an additional font cartridge. If there is an additional font cartridge, the system proceeds to step 23 and the header of the font cartridge is examined to determine what fonts are available and the address of each character of the available fonts. If there is no font cartridge available, the system proceeds to step 24 where the printer receives a print command from the host computer, requesting a certain font character. At step 25, the printer firmware determines the location (resident font or additional cartridge) of the requested character and reads the entire character sequentially. At step 26, the character is rasterized and printed or saved.

The disadvantage of the system described in FIGS. 1 and 2 is a limited number of address lines on address and control bus 18 that lead to the font cartridge 17. Therefore, the addressable memory space at font cartridge 17 is limited.

The present invention provides a system that allows a larger memory space to be addressed without adding address lines. In addition, the system of the present invention is transparent to the host computer as well as the printer firmware. The present invention takes advantage of the fact that each font character has a specific starting address, and, once a font character is accessed, the address accesses are sequential (except for occasional repeated accesses to the same word address).

The present invention provides multiple "planes" of font character data. The starting address of a font character to be accessed determines the appropriate memory plane to be accessed. The system of the present invention first identifies a starting address of a font character, selects the appropriate memory plane and maintains access to that plane until another starting address is received. At that time, a determination is made whether to switch memory planes or remain in the present memory plane.

Each memory plane contains identical memory address locations as every other memory plane. However, each memory plane is constrained to specific valid starting addresses. The configuration of these memory planes is illustrated by example in FIG. 3.

Figure 3:
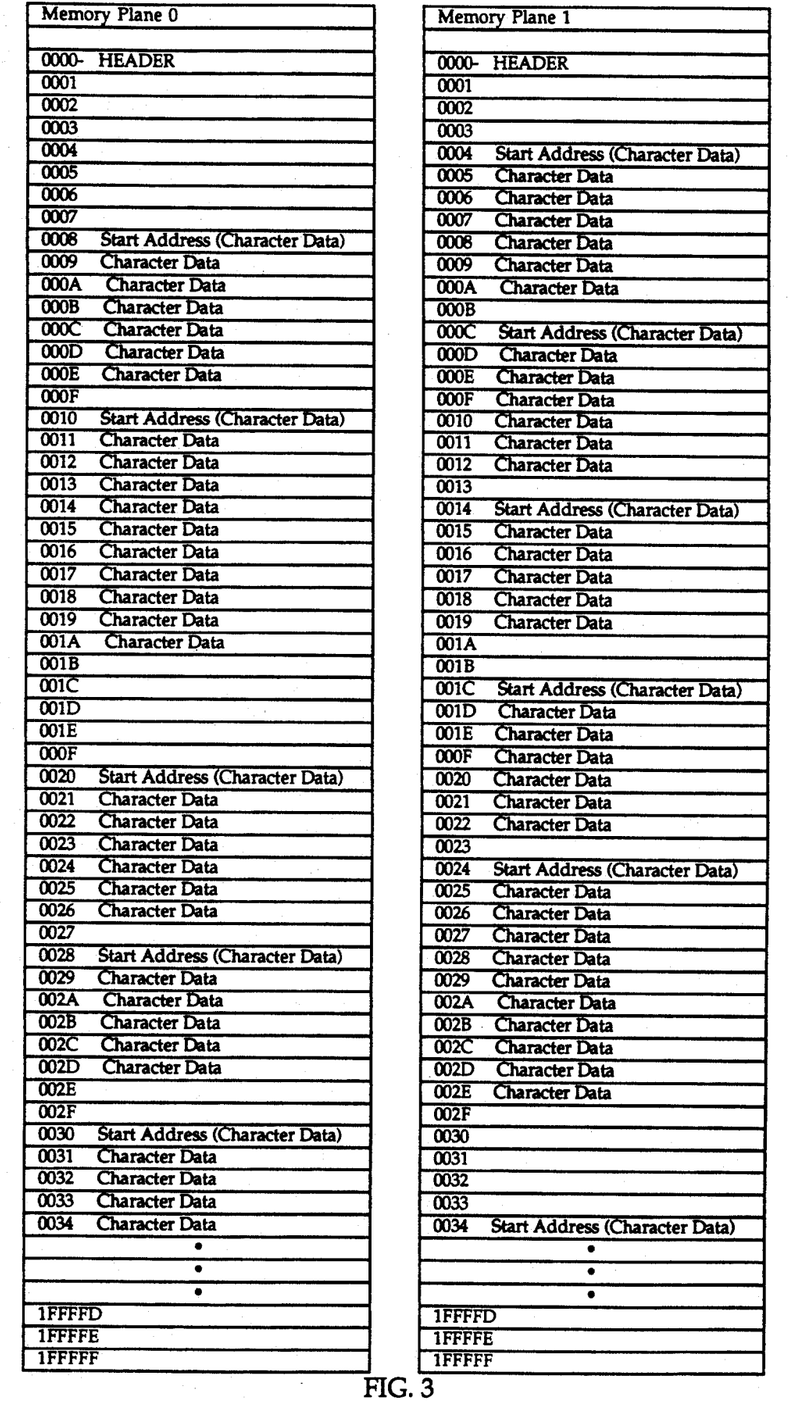
FIG. 3 illustrates two memory planes of the preferred embodiment of this invention.

A block diagram of a font cartridge of the present invention having two memory planes is illustrated in FIG. 3. The use of two memory planes is by way of example only, as the present invention supports a plurality of memory planes that can be accessed by a given number of address lines. Referring to FIG. 3, a font cartridge of the present invention includes memory plane zero and memory plane one. Each memory plane includes hexidecimal address space 000000 to 1FFFFF. A portion of each memory plane is reserved for header information. In the preferred embodiment of the present invention, the header information in each memory plane is identical and identifies all the available fonts as well as the starting address locations of each character of each font on both memory planes. Memory plane zero includes a separate area for character data of fonts resident on memory plane zero. Memory plane one includes a separate character data area with descriptive information of font characters resident on memory plane one.

The present invention limits the valid starting address of memory plane zero and one. For example, in one embodiment of the present invention, memory plane zero can only have valid starting addresses for those addresses whose least significant nibble is 0 or 8. Memory plane one is limited to starting addresses having a least significant nibble of 4 or C (in hexidecimal format).

Referring to memory plane zero, starting addresses for five font characters are shown at address location 0008, 0010, 0020, 0028 and 0030. Each starting address is followed by one or more words of character data at sequential address locations. If necessary, the character data may extend beyond the next valid starting address. For example, for the font character having a start address of 0010, the character data extends to address 001A, and includes address 0018, normally a valid starting address.

Memory plane one has font character data at start addresses 0004, 000C, 0014, 001C, 0024 and 0034. As is the case with memory plane zero, character data may extend past the next valid starting address. For example, the font character at address 0024 extends to address 002E, past valid starting address 002C.

Still referring to FIG. 3, it can be seen that addresses that are starting addresses in one memory plane can still be used for character data in the other memory plane. For example, memory address 0008 is a start address in memory plane zero and contains character data in memory plane one.

Figure 4:
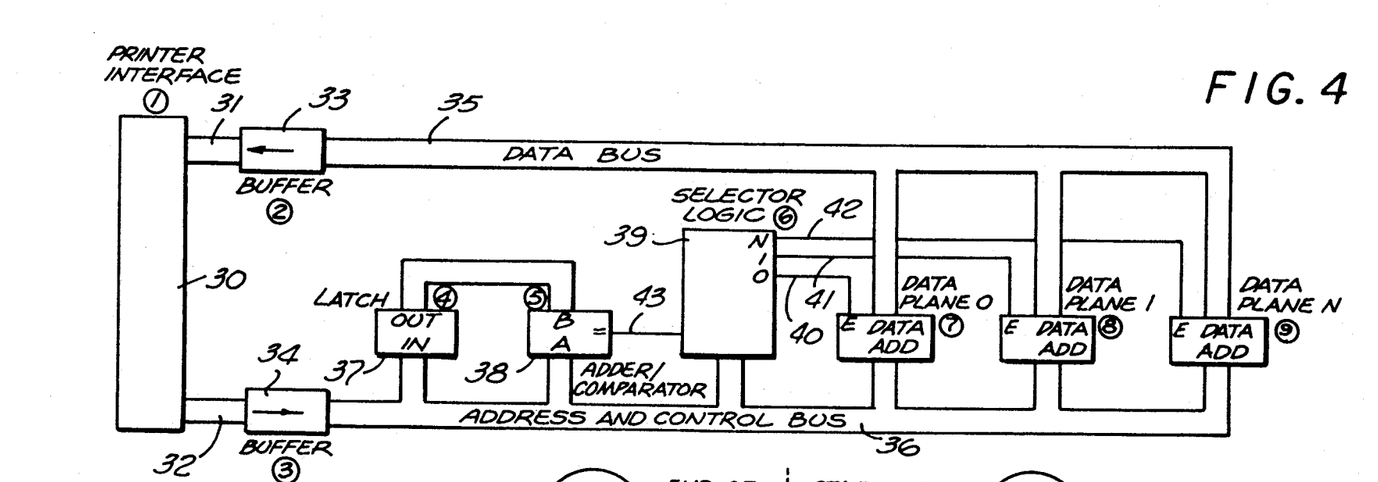
FIG. 4 is a block diagram of the preferred embodiment of the font cartridge of the present invention.

FIG. 4 is a block diagram illustrating the preferred embodiment of the font cartridge of the present invention. The cartridge communicates with the control and data bus 18 through a printer interface 30. The printer interface provides address and control information to address and control bus 36 through buffer 34. The address and control information is also provided to in/out latch 37 coupled to bus 36. Latch 37 is coupled to adder/comparator 38. Comparator 38 is also coupled to address and control bus 36. Comparator 38 provides an output 43 to selector logic block 39. Selector logic block 39 is also coupled to address and control bus 36. The selector logic block 39 provides enable outputs 40, 41 and 42 to data plane zero, data plane one and data plane N, respectively. Data plane zero, data plane one and data plane N receive address information from address and control bus 36 and provide data onto data bus 35. Data bus 35 provides data to printer interface 30 through buffer 33.

The latch 37 captures the state of the address bus at the end of each printer access cycle. This captured address is compared with the current state of the address bus at the beginning of each access cycle by the adder/comparator block 38. The output 43 of this block is active if the current address is equal to the captured address, or is one word location greater than the captured address (thus indicating a sequential or repeated data word access). The output 43 is inactive otherwise. The output 43 of comparator 38 is examined by the selector logic block 39. An inactive output 43 of comparator 38 is an indication that the current printer access cycle may require switching of the data plane. An active signal 43 indicates that the access cycle does not require a data plane switch. When the signal 43 is inactive the selection of the data plane by selector logic block 39 is determined by examining the pattern of the lower address bits.

The receipt of a starting address does not necessarily require a change in data planes. The starting address may be to another character in the same memory plane as is currently selected. After the appropriate data plane is selected, the address is provided to the data plane and the information at that memory address is provided on data bus 35 through buffer 33 to the printer interface 30.

Each instance of character data begins at an address that, when specified for reading by the microprocessor, will result in a specific pattern in the lower address lines (the address lines corresponding to the least significant bits in the address value). This specific pattern in the lower address lines is determined by which "plane" the data is expressed in, as seen by the switching hardware (latch 37, adder/comparator 38).

The function of the switching hardware is to detect when the reading of a character is beginning. At these times, based on the pattern in the lower address lines, the hardware switches the corresponding "plane" in so that the appropriate data is seen by the microprocessor.

The switching hardware does this by detecting breaks in the sequential/repeat access pattern seen when reading character data words. A break in the pattern is detected whenever a word address in the cartridge is accessed that is not the same address as, or the address sequentially following, the address of the word last read by the microprocessor. In such "break" cases, the lower address lines are used to determine the appropriate memory plane and to switch the memory plane, if necessary.

These sequential/repeat access "breaks" can occur under the following conditions:

1. The microprocessor is not reading character data, but something else (common font header, etc.). Since all data other than character data is duplicated on each 2 megabyte plane, appropriate values are found, regardless of which plane is selected by the switching hardware.

2. The microprocessor is reading the first or second word of character data. In this case, because of the choice of starting addresses for al instances of character data, the appropriate "plane" is selected by the switching hardware. As the microprocessor continues to read the character data, no access will cause the "break" condition to be detected, so the appropriate 2 megabyte plane will remain selected and the microprocessor will read valid data for the character.

Figure 5:
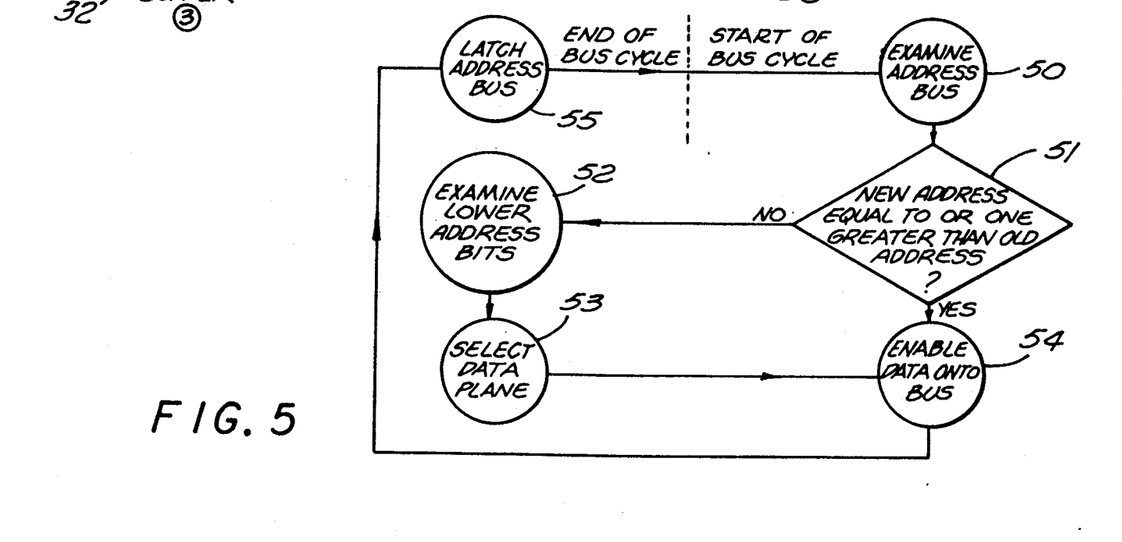
FIG. 5 is a flow chart illustrating the operation of the present invention.

A flow diagram illustrating the operation of the preferred embodiment of the present invention is illustrated in FIG. 5. At step 50, the address bus is examined, using the selection hardware (latch and address comparator). At decision block 51, the argument "new address equal to or one greater than old address?" is made. If the argument is false, this means that a new starting address has been detected and the system proceeds to step 52. At step 52, the lower address bits are examined in the selector logic. At step 53, the lower address bits are used to select the appropriate data plane. This may or may not involve switching from the current data plane. The system then proceeds to step 54. If the argument at decision block 51 is true, no new starting address is detected and the system proceeds to step 54. At step 54, the data at the current address location is enabled onto the data bus. The system then latches the old address from the address bus at step 55 ending the bus cycle.

The maximum number of 2 megabyte planes of data is determined by the number of lower address lines used by the switching hardware. When the switching hardware detects a break, and is selecting the appropriate plane, the lower address lines are used as a binary value for which plane to select. If one address line is used, then the hardware selects from planes zero and one. If two address lines are used, then the choices are 0, 1, 2 and 3. If N address lines are used, then planes 0... ((2**N)−1) are available.

For a given number of address lines (e.g., N), the maximum number of planes is $2^N$.

In the preferred embodiment, address line A2 (binary 4's place) corresponds to the least significant bit of the binary value for the memory plane's index. If more than one address line is used, A3 is next, and A4 and so on.

So the address lines [A(N+1)... A2] are used to form the binary plane index value.

The starting address for character data in a given plane index (say P) is such that:

(Address) mod 4=0

((Address) mod $(2^{(N+2)})$)/4 = P (Plane Index)

Put another way, for N address lines used, and plane index P, the "eligible" starting addresses in the 2 megabyte space are calculated as follows:

First eligible starting address at P times 4.

Successive starting addresses occur every $(2^{(N+2)})$ byte locations.

In the preferred embodiment of the present invention, there are rules that govern the selection of starting addresses for font character data. The starting addresses are generated one plane at a time. For the first plane, the valid starting addresses are selected. However, because the character data can extend beyond the next starting address, some valid starting addresses are removed from the list of eligible starting addresses as font characters are assigned to memory address locations.

After the first memory plane is filled, valid starting addresses for the next memory plane are determined. First, all potential starting addresses (based on the low order of bits) are determined. Any potentially valid starting address that does not have a gap of at least one address location between itself and the ending address of any character in this or any previously filled memory plane is removed from the list of valid starting addresses. When character data is entered in the second memory plane, an "end check" is performed. A character cannot end on the same address, one prior address or one subsequent address as another character's starting address in a previously filled plane. If this test is not passed, the next eligible starting address is tested.

Figure 6:
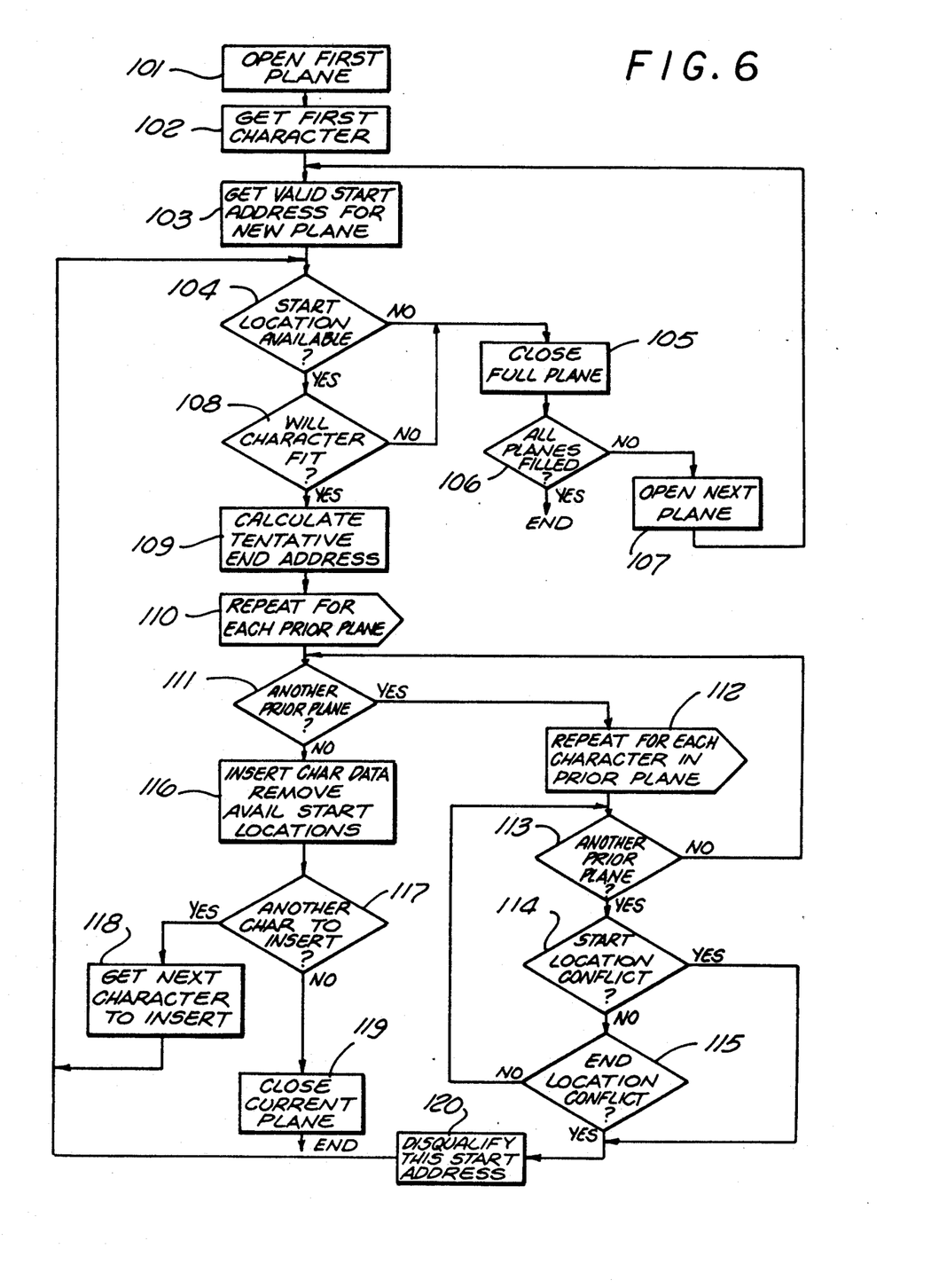
FIG. 6 is a flow chart illustrating the assignment of starting addresses in a plurality of memory planes.

A flow diagram illustrating a method of assigning starting addresses, filling a plane with character data and performing conflict checks is illustrated in FIG. 6. At step 101, the first memory plane is opened and at step 102 a font character is selected for storage in the memory plane. At step 103, the valid starting addresses for the current plane are obtained, (for example, in memory plane zero of FIG. 3, only addresses having a least significant nibble of 0 or 8 are valid starting addresses).

At decision block 104 the argument "Start location available?" is made. This argument determines if any start addresses are available in that memory plane, or if they have all been used or disqualified. If the argument at block 104 is false, the system proceeds to step 105 and the current plane is closed. At decision block 106, the argument "All planes filled?" is made. If the argument is true, no more character data can be stored and the system exits the flow chart. If the argument is false, the system proceeds to step 107. At step 107, the next available memory plane is opened and the system returns to step 103.

If the argument at decision block 104 is true, the system proceeds to decision block 108 and the argument "Will character fit?" is made. This is to determine if the storage of the character will extend beyond the end of the memory plane. If the argument is false, the system proceeds to step 105. If the argument at decision block 108 is true, the system proceeds to step 109.

At step 109, the tentative end address of the character is calculated. The system then proceeds to step 110 to execute a validity check of the end address of the character. The steps beginning at step 110 are repeated for each prior plane that has been used to store character data. At decision block 111, the argument "Another prior plane?" is made. If the argument is true, the system proceeds to step 112 to perform a validity check for each character in the prior plane.

At decision block 113, the argument "Another prior character?" is made. If the argument is false, the system returns to decision block 111. If the argument is true at decision block 113, the system proceeds to decision block 114 and the argument "Start location conflict?" is made. This is to determine if the starting address of the character to be stored conflicts with the ending addresses of any previously stored characters. The starting address of a new character cannot be the same address as the ending address of a prior character or one address greater than or one address less than the ending address of a prior character.

If the argument at decision block 114 is false, (no starting address conflict), the system proceeds to decision block 115 to perform an end address conflict check. If the argument at decision block 114 is true (starting address conflict detected), the system proceeds to step 120, where that start address is disqualified and the system returns to step 104 to obtain a new potential start location.

At decision block 115, the argument "End location conflict?" is made. This is to determine if the end address of the character to be stored conflicts with the starting addresses of any previously stored characters. A character cannot end on the same address, one prior address or one subsequent address as another character's starting address in a previously filled plane. If the argument at decision block 115 is true (end address conflict detected), the system proceeds to step 120 and the start address is disqualified. If the argument at decision block 115 is false (no conflict detected), the system returns to decision block 113 to determine if other prior characters must be checked against the character to be stored.

After all characters in a plane have been checked against the character to be stored (argument at block 113 is false), the system returns to decision block 111 to determine if other planes need to be checked. If all planes have been checked (argument at block 111 is false), the system proceeds to step 116. At step 116, the character is stored beginning at the start address and that start address is removed as an available start address.

The system then proceeds to decision block 117 and the argument "Another character to insert?" is made. If the argument is false, the system proceeds to step 119, and the current plane is closed. This occurs when all characters have been stored. If the argument at decision block 117 is true, the system proceeds to step 118, a new character is obtained and the system returns to block 104.

The following code illustrates one example of a method for implementing the operations described in FIG. 6. The code is given by way of example only and other means of implementing the methods of validating starting addresses may be used without departing from the scope of this invention.

---
Conflict Detection Code
---
Conflict detection for tentative insertion of data item.

---
-continued
---
Conflict Detection Code
---

```
Global variables and data structures hold current state of system.
Passed tentative starting address and ending address (address
of last word with data) for insertion into the current plane.
       Returns non-zero (TRUE) if a conflict is present.
       If no conflict, returns zero (FALSE). Does not modify
the state variables to reflect insertion.
static   int    _conflict (start, end)
long     start;   /*byte address of first word with data*/
long     end;     /*byte address of last word with data*/
                  /*... so size if ((end-start) + 2) bytes*/
{
int      n, nent, inx, diff;
fol_ptr  fptr;
long     emin, emax, smin, smax, *lptr;
       /*----- if on first plane (c_place index == 0), no
       conflict-----*/
       if (! c_plane) return (0);
       /*----- set min and max conflicting ending address for
       other planes -*/
       emin = end - con_play;
       emax = end + 2;
       /*----- set min and max conflicting start address for
       other planes --*/
       smin = start - 2;
       smax = start + con_play;
       /*----- for each plane of lower index than the current
       plane... -----*/
       for (n = c_plane, fptr = fol_list; n; --n, ++fptr)
           {
           /*----- local de-reference of max entries to check this
           plane -*/
           nent = fptr->n_entries;
           /*-----------------------------------------------------*/
           /*----- prior checks may have excluded conflicts with
           lower ---*/
           /*----- address entries, so start there and advance. ----*/
           /*----- Here advance in start address list until in or
           beyond -*/
           /*----- conflict range due to candidate ending
           address -----*/
           for (
               lptr = fptr->start. cl, inx = pftr->start. inx,
               diff = 0;
               (*lptr < emin) && (inx < nent);
               ++inx, ++lptr, ++diff
           );
           /*----- if advanced any, update to optimize next time
           called --*/
           if (diff)
               {
               fptr->start. cl = lptr;
               fptr->start. inx = inx;
               }
           /*----- if starting address stopped within range,
           conflict -----*/
           if ((inx < nent) && (*lptr <= emax)) return (1);
           /*-----------------------------------------------------*/
           /*----- No conflicts in this plane due to the candidate
           data --*
           /*----- ending address. Now perform same method for
           checking --*/
           /*----- conflicts due to its starting address ---------*/
           for (
               lptr = fptr->end. cl, inx = fptr->end. inx, diff = 0;
               (*lptr < smin) && (inx < nent);
               ++inx, ++lptr, ++diff
           );
           /*----- if advanced any, update to optimize next time
           called --*/
           if (diff)
               {
               fptr->end. cl = lptr;
               fptr->end. inx = inx;
               }
           /*----- if ending address stopped within range,
           conflict -----*/
           if ((inx < nent) && (*lptr <= smax)) return (1);
           }
/*----- if we survive until here, no conflicts in any planes, so -----*/
/*----- return zero (FALSE) -----------------------------*/
return (0);
```

-continued

Conflict Detection Code

```
}
        Discovers first available starting location in current
plane for a data item of the given length. If all remaining starting
locations in the current plane are exhausted, closes the current
plane and opens the next plane for filling, unless all planes have
been exhausted.
        Each eligible address is examined for conflicts with data
in order planes by calling the __conflict function above.
        If a valied starting address is located, returns that offset
and pointer to the (different if opened new plane) FILE pointer.
The function return value will be non-zero (TRUE) to indicate
that the data can be accommodated.
        If last available plane is exhausted, returns zero
(FALSE) to indicate no more data can be accommodated.
int     fol__next__addr (clen, osret, fnret)
int     clen;       /*length of data item in bytes*/
long    *osret;     /*if found, return starting address here*/
FILE    **fnret;    /*if found, return FILE pointer here*/
{
long    os, nos, eos;
int     fits;
        /*----- continue until find starting point in plane, or
        exhausted -*
        do
            {
            /*----- from end of plane's file, round to eligible
            start -----*/
            nos = ((os = fb__tell (fnow)) & ol__bic) + plane__add;
            /*----- need to round upward to eof or greater -----*/
            if (nos < os) nos += ol__rep;
            /*----- for statistics, record filler space not used -----*/
            if (nos>os) align-pad += (nos = os);
            /*----- byte address of last word with data -----*/
            eos = nos + clen - 2;
            /*----- loop until find starting address that doesn't -----*/
            /*----- or until run out of room on the current
            plane -----*/
            while
                        (fits = eos < data__end) /*still fits*/
                &&
                        __conflict (nos, eos) /*in conflict,
                                get next*/
                )
            {
                /*----- advance start and end address to next
                eligible --*/
                nos += ol__rep;
                eos += ol__rep;
                /*----- and update stats on conflict hits and fill --*/
                ++n conflicts;
                con__pad += ol__rep;
            }
        /*----- If (fits == TRUE) we've found good address; else -----*/
        /*----- we've fallen out of current plane --------------------*/
        if (! fits)
            {
            /*----- close current plane ---------------*/
            __fol__eplane ();
            /*----- if that was last plane, return (FALSE) for
            full -*/
            if ((c__plane + 1) >=n__planes) return (0);
            else
                {
                /*----- increment plane index and start new
                one -----*/
                ++c__plane;
                __fol__splane ();
                }
            }
        }
while (! fits);
/*----- if we fall out of loop, we have valid address for data
item -*/
/*----- update the state variables to show new data item
residing ---*/
*fl__stat++ = nos;
*fl__end++ = eos;
/*----- increment index of elements in plane, range check -----*/
if (++fl inx >= fl__max) bail ("plane overlay overflow");
/*----- if padding needed, do it so caller can write directly -----*/
if (nos > os) pad__zero (fnow, nos);
```

-continued

Conflict Detection Code

```
/*----- report offset and (possibly new) file pointer -----*/
*osret = nos;
*fnret = fnow;
return (1);
}
/*****************************************************/
long    fol__room__left ()
{
        return (data__end - fb__tell (fnow));
}
static  void    __fol__splane ()
{
char    bf[20];
fol__ptr        xfol;
int     n;
        cfol    = fol__list + c__plane;
        fl__inx = cfol->n__entries = 0;
        fl__start =cfol->start. list = (long*) fb__malloc
                        (plane__a);
        fl__end = cfol->end. list = (long*) fb__malloc (plane__a);
        for (xfol = fol__list, n = c__plane; n; --n, ++xfol)
            {
            xfol->start. inx = 0;
            xfol->start. cl = xfol->start. list;
            xfol->end. inx = 0;
            xfol->end. cl = xfol->end. list;
            }
        sprintf (bf, "%s.%d", bname, c__plane);
        fnow = fb__open (bf, "wb");
        pad__zero (fnow, d__start);
}
static  void    __fol__eplane ()
{
        pad__zero (fnow, d__break);
        fclose  (fnow);
        fnow = NULL;
        cfol->n__entries = fl__inx;
        plane__add += granularity;
}
void    fol__close (fth, np__ret)
FILE    *fth;
int     *np__ret;
{
int     i;
char    bf[20];
        if (fnow != NULL)__fol__eplane ();
        for (1 = 0; 1 <= c__plane; ++1)
            {
            sprintf (bf, "%s.%d", bname, i);
            fnow = fb__open (bf, "rb+");
            fb__seek (fth, OL);
            zxfer (fth, fnow, d__start);
            fclose (fnow);
            }
        *np__ret = c__plane + 1;
}
void    fol stats (ar, cr, nr)
long    *ar;
long    *cr;
long    *nr;
{
        *ar     = align__pad;
        *cr     = con__pad;
        *nr     = n__conflicts;
}
```

This technique of data organization and switching hardware as describe herein is not limited to font cartridges but is applicable to other types of data as well. The general criteria for data organization in the present invention are:

1. Data reading by device microprocessor begins within some number of words from the beginning of the data.
2. Data is read in sequential order, except for repeated access to the same word address. Sequential order means one greater word address each read.

3. Data is read to within some number of words to the end of the data.
4. The above reads occur with no intermediate reads by the microprocessor to any other word in the cartridge address space.

For the example of the font cartridge of the preferred embodiment of this invention, the criteria are:
1. Reads begin within one word of data beginning.
2. Data is read in sequential order, except for repeated access to the same word address. Sequential order means one greater word address each read.
3. Reads continue through last word of data.
4. The above reads occur with no intermediate reads by the microprocessor to any other word in the cartridge address space.

Thus, a method for increased memory space in an address limited system is described.

We claim:

1. A memory systems comprising:
   an address bus for providing a plurality of addresses;
   a plurality of memory planes coupled to said address bus;
   comparing means coupled to said address bus for providing a first output signal when a predetermined condition is satisfied by a comparison of a current address with a preceding address;
   memory selection means coupled to said comparing means and said address bus, said memory selection means for enabling one of said memory planes based on a first number of bits of said current address when said first output signal is received.

2. The memory system of claim 1 further including latching means coupled to said address bus and said comparing means, said latching means for storing said preceding address.

3. The memory system of claim 1 wherein said predetermined condition is satisfied when said current address is not the same address and is not the next higher address.

4. The memory system of claim 1 wherein said number of bits comprises one bit.

5. The memory system of claim 4 wherein said plurality of memory planes comprises two memory planes.

6. The memory system of claim 1 wherein an address that satisfies said predetermined condition is a starting address.

7. A cartridge for use in a printer, said printer including an address bus for providing addresses to said cartridge, said cartridge comprising:
   a plurality of memory planes coupled to said address bus;
   comparing means coupled to said address bus for providing a first output signal when a predetermined condition is satisfied by a comparison of a current address with a preceding address;
   memory selection means coupled to said comparing means and said address bus, said memory selection means for enabling one of said memory planes based on a first number of bits of said current address when said first output signal is received;
   a data bus coupled to said plurality of memory planes for receiving data from said enabled memory plane.

8. The cartridge of claim 7 further including latching means coupled to said address bus and said comparing means, said latching means for storing said preceding address.

9. The cartridge of claim 7 wherein said predetermined condition is satisfied when said current address is not the same address and is not the next higher address.

10. The cartridge of claim 9 wherein an address that satisfies said predetermined condition is a starting address of a font character.

11. The cartridge of claim 10 wherein said number of bits comprises one bit.

12. The cartridge of claim 11 wherein said plurality of memory planes comprises first and second memory planes.

13. The cartridge of claim 12 wherein starting addresses in said first memory plane are limited to hexidecimal addresses ending in "0" and "8".

14. The cartridge of claim 13 wherein starting addresses in said second memory plane are limited to hexidecimal addresses ending in "4" and "C".

15. The cartridge of claim 7 wherein said plurality of memory planes comprises read only memory (ROM) means.

16. A method of addressing memory locations in a cartridge for use in a printer having an address bus for providing a plurality of addresses, said method comprising the steps of:
   providing a plurality of memory planes for storing font character information;
   comparing a current address on said address bus to a preceding address;
   enabling a memory plane selector when said comparison satisfies a predetermined condition;
   reviewing a first number of bits of said current address in said memory plane selector when said selector is enabled and enabling one of said memory planes dependent on a value of said first number of bits;
   providing said current address to said enabled memory plane;
   reading data from said enabled memory plane at said current address and providing said data to a data bus.

17. The method of claim 16 wherein an address that satisfies said predetermined condition is defined as a font character starting address.

18. The method of claim 17 wherein said number of bits comprises N bits.

19. The method of claim 18 wherein said plurality of memory planes comprises $2^N$ memory planes.

20. The method of claim 19 wherein valid starting addresses in a memory plane P are such that $((\text{Address}) \text{ modulo } (2^{(N+2)}))/4 = P$.

21. The method of claim 16 wherein said plurality of memory planes comprises first and second memory planes.

22. The method of claim 21 wherein starting addresses in said first memory plane are limited to hexidecimal addresses ending in "0" and "8".

23. The method of claim 22 wherein starting addresses in said second memory plane are limited to hexidecimal addresses ending in "4" and "C".

* * * * *